United States Patent [19]

Reisfeld et al.

[11] 4,367,367

[45] Jan. 4, 1983

[54] COLLECTOR FOR SOLAR ENERGY

[76] Inventors: Renata Reisfeld, 10a Strauss St., Jerusalem; Samuel Neuman, 19 Wingate St., Haifa, both of Israel

[21] Appl. No.: 252,468

[22] Filed: Apr. 9, 1981

Related U.S. Application Data

[63] Continuation-in-part of Ser. No. 54,603, Jul. 3, 1979, abandoned.

[30] Foreign Application Priority Data

Jul. 4, 1978 [IL] Israel .................................... 55079
Feb. 26, 1979 [IL] Israel .................................... 56742

[51] Int. Cl.³ ............................................. H01L 31/04
[52] U.S. Cl. ............................................. 136/247
[58] Field of Search ................................... 136/247

[56] References Cited

U.S. PATENT DOCUMENTS 4,110,123  8/1978  Goetzberger ................. 136/247
4,127,425 11/1978  Chambers ..................... 136/247
4,171,003 10/1979  Forrat ......................... 136/247
4,173,495 11/1979  Rapp et al. ................... 136/259
4,188,238  2/1980  Boling ......................... 136/247

OTHER PUBLICATIONS

J. A. Levitt et al., "Materials for Luminescent Greenhouse Solar Collectors", *Applied Optics.* vol. 16, pp. 2684-2689 (1977).
H. W. Gandy et al., "Radiationless Resonance Energy Transfer from $UO_2{}^{2+}$ to $Nd^{3+}$ In Coactivated Barium Crown Glass", *Appl. Phys. Lett.*, vol. 4, pp. 188-190 (1964).
A. Goetzberger et al., "Solar Energy Conversion with Fluorescent Collectors", *Appl. Phys.*, vol. 14, pp. 123-139 (1977).
*Nature,* "Planar Solar Energy Converter and Concentrator Based on Uranyl Doped Glass," Jul. 13, 1978, vol. 274, pp. 144-145.
Weber et al., *Appl. Phys.*, 15 (1976), pp. 2299-2300.

*Primary Examiner*—Aaron Weisstuch
*Attorney, Agent, or Firm*—Fleit & Jacobson

[57] ABSTRACT

The present invention relates to a collector adapted to concentrate solar energy onto a photoelectric cell comprising in combination at least one glass plate doped with a substance resulting in fluorescence when said plate is irradiated by sunlight, a photoelectric cell being attached to a lateral side of the plate, the other lateral edges of the plate being provided with a reflective coating, said cell having a high efficiency in the range of wavelength of the fluorescent radiation.

A plurality of such glass plates can be stacked one upon the other, each doped to absorb at a predetermined region of the spectrum and to fluoresce in a region where a certain photocell is sensitive.

A fluorescent dye in a suitable carrier can be applied as a surface layer on such glass plates, and this improves the overall efficiency of the collector.

8 Claims, 6 Drawing Figures

COLLECTOR FOR SOLAR ENERGY

RELATION TO OTHER APPLICATIONS

The present patent application is a continuation-in-part application to patent application Ser. No. 054,603 filed July 3, 1979, now abandoned.

FIELD OF THE INVENTION

The present invention relates to means for concentrating solar energy on solar cells, optimizing the utilization of solar energy.

The invention is based on the use of planar or substantially planar glass plates, doped in a suitable manner, provided with reflecting means at the lateral sides and at the lowermost glass surface, a solar cell being attached to one of the lateral sides of the glass plate.

The invention is illustrated with reference to one single glass plate, advantageously doped with uranyl ions, possibly also with additional ions; and furthermore with reference to solar collectors based on the use of a plurality of plates of different glasses, each of which is provided with a solar cell having a high efficiency at the wavelength at which the respective glass fluoresces.

One aspect of the invention relates to an improved planar fluorescent collector adapted to concentrate solar energy onto a solar cell and which converts part of the solar spectrum, and especially the part in the ultraviolet and blue region, to longer wavelengths, which are better utilized by solar cells. The invention further relates to means for converting part of the solar radiation to longer wavelength and for dissipating undesired heat, while the concentrated solar radiation is concentrated onto a solar cell. Other and further features of the invention will become apparent hereinafter.

The invention further relates to a planar or substantially planar collector adapted to absorb a substantial part of the solar spectrum and to emit the energy in concentrated form at predetermined wavelength onto two or more different photoelectric (solar) cells provided at one or more of the lateral walls of the said collector.

The device relates to an improved solar collector, which substantially increases collection efficiency of solar radiation and which makes possible to concentrate solar energy, after suitable conversion to other wavelengths, onto a plurality of solar cells, thus substantially increasing the overall efficiency and economics of such system.

BACKGROUND OF THE INVENTION

Silicon semiconductors play a key role in most types of solar energy conversion due to their electro-optical properties and the technology of production of such cells is highly developed. It is one of the serious drawbacks of such cells that they are quite expensive and thus their widespread use for the conversion of solar energy to electrical energy is not yet economical. One of the ways to overcome this drawback is to concentrate the incoming flux of solar radiation onto a solar cell, increasing conversion efficiency and substantially reducing the surface area of the solar cells required per unit area of solar flux. Various suggestions have been made how to focus solar energy on solar cells, but conventional means concentrate the entire solar radiation, including heat radiation. Solar cells generally have a maximum of sensitivity about 800 nm, and if heat energy and radiation in other parts of the spectrum is concentrated on such solar cells, the overall efficiency is quite low.

Recently, Weber et al, App. Phys. 15, (1976) 2299-2300 suggested the use of luminescent solar collectors and proposed the use of neodymium doped laser glass or rhodamino-6-G as luminescent material. Their calculations show the relation between trapping of radiation and the refractive index of the collector.

Utilization of solar energy in an efficient manner is one of the main goals of science in order to provide an economic and convenient energy source. One of the main problems encountered is the comparatively high cost of solar cells and of other components of devices designed for solar energy utilization. Large scale terrestrial conversion systems must exceed a certain threshold value of efficiency in order that they be competitive with other available energy sources. Such devices must be installed on a given plot of land, maintained and operated. At present there are known silicon cells which have conversion efficiencies of about 15% at $AM=0$ and over 18% at $AM=1$ ($AM=$air mass through which the solar flux penetrates; $AM=1$ at sea level for sun overhead). These values are within about 5 to 9 percent of theory. Solar cells are quite expensive and only by concentrating the solar energy on such cells can the problem of cost be overcome, and this only if the concentrating means are inexpensive and efficient.

It has been proposed to link a photovoltaic cell to a small glass plate: See Nature, July 13, 1978, "Planar Solar Energy Converter and Concentrator Based on Uranyl doped Glass." This article set out the basic principles of such energy conversion, but does not describe an efficient embodiment which is of practical value for obtaining the required degree of efficiency.

In U.S. Pat. No. 4,110,123, issued Aug. 29, 1978 there is described an apparatus for converting solar energy into electrical energy, wherein light is collected in a light concentrator comprising a transparent layer, the refraction coefficient of which is greater than that of the ambient medium and which contains fluorescent centers and is fed to a solar cell, characterized in that more than one concentrator/solar cell combination is stacked on top of another through the intermediary of a medium having a smaller refraction coefficient than that of the concentrators, each concentrator being adapted to convert a portion of the incident spectrum into fluorescent light and supply it to a solar cell.

The U.S. patent suggests a similar principle, but it is based on the use of glass cells containing solvents with fluorescent centers. The use of liquid mixtures is complicated and inefficient and such cells require constant maintenance and upkeep. The said patent does not contain any teaching of a working embodiment and thus it constitutes only a mere suggestion of the principle of a multi-layer collector. The present invention discloses specific doped glasses and an arrangement whereby a considerable proportion of the incident energy is converted to utilizable electric energy.

SUMMARY OF THE INVENTION

According to the present invention there is provided a device adapted to convert part of solar radiation which is generally not utilized efficiently by conventional solar cells to radiation which is utilized to a larger degree by such cells, and which concentrates solar radiation on solar cells, thus diminishing the area of such cells required for a given area of flux.

The device according to the present invention comprises a suitably doped medium which absorbs strongly in the UV and blue regions of the solar spectrum and which converts this radiation to longer wavelengths, the geometrical arrangement of the device being such that the solar energy is focused on a solar cell, resulting in a highly increased efficiency of solar energy conversion to electrical energy. According to a preferred embodiment of the invention uranyl-doped glass is used as medium for the conversion of the UV and blue part of the spectrum to higher wavelengths. The energy obtained from the uranyl-doped glass can be further converted to a still better utilized wavelength, namely in the 800 nm region, by adding a rare earth to the doped glasses.

The device according to the present invention is in a geometrical form which results in the focusing of the solar energy onto a small-size solar cell. The form of choice is a planar collector, provided with reflecting means on its lower and lateral sides, one of the lateral sides being attached to a solar cell.

The most simple shape is that of a rectangular slab, as this is least expensive to manufacture. It is within the ambit of the present invention to use other suitable geometrical shapes which result in the desired focusing of the radiation on a solar cell. The uranyl ion may be incorporated into various types of glass: for example there may be mentioned glasses such as $BaO.P_2O_5$; $SrO.P_2O_5$; $CaO.P_2O_5$; silicate glasses of the type $CaO.SiO_2.Na_2O$. The slab of glass can be of any suitable dimension; thicknesses of from about 1 mm to about 10 mm were tested and found to be suitable. The ratio of thickness to lateral dimensions can vary within wide limits: for example a range of from 1:10 to about 1:100 of thickness to lateral dimension was tested and good results were obtained.

The absorption of uranyl ion is quite high, and it is about 5 orders of magnitude higher than that of neodymium, and thus it is possible to attain a complete absorption of solar radiation with small concentrations of $UO_2^{++}$. The uranyl ion absorbs in the part of the spectrum to which the silicon cells are not sensitive and thus energy which is otherwise lost is utilized by the device of the invention. Uranyl fluoresces with a high quantum efficiency at ambient temperature at longer wavelengths at which the sensitivity of the silicon cell is higher that of natural solar radiation. The geometrical configuration results in an efficient utilization of the desired part of the radiation, while at the same time unwanted heat is dissipated by the comparatively large area of the collector. Non-radioactive uranyl is abundant: it is a byproduct of separation of $^{235}U$ and quite inexpensive.

When uranyl doped glass is doped by the addition of $Eu^{3+}$ the wavelength of the emitted radiation is about 612 nm and this further increases the utilization of radiation by solar silicon cells.

Figure 1:
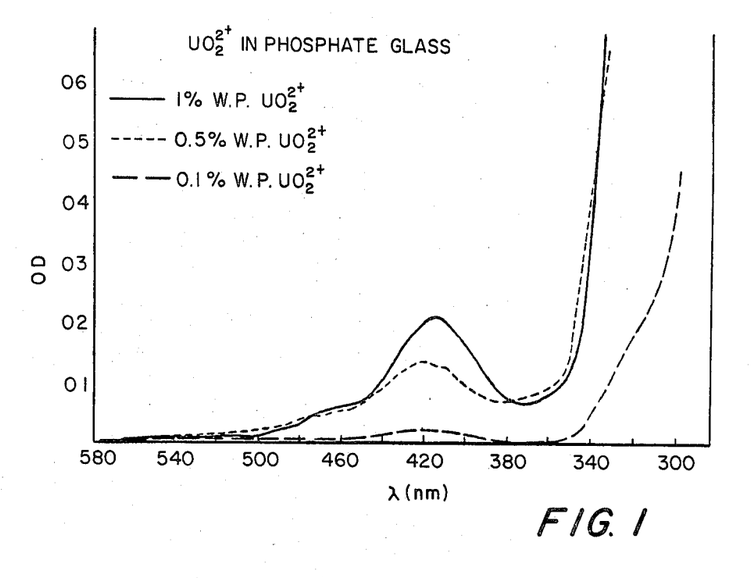
FIG. 1 is an Absorption Spectrum of $UO_2^{++}$ in phosphate glass.
Figure 2:
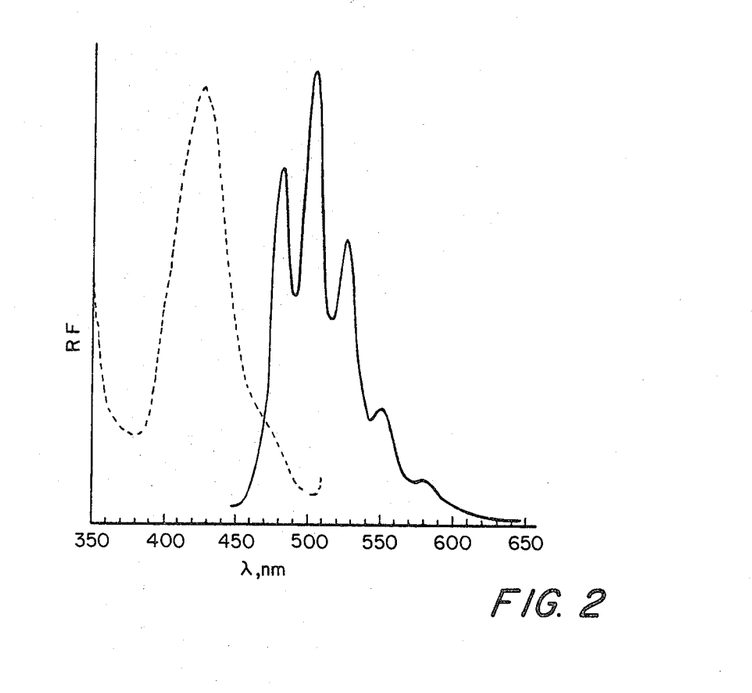
FIG. 2 is an emission Spectrum of $UO_2^{++}$ in phosphate glass.

The absorption spectrum of uranyl ion in phosphate glass has been studied by Lieblich-Sofer et al., Inorg. Chim. Acta (1978) and the spectrum is presented as FIG. 1. Excitation of uranyl in these bands results in a strong visible fluorescence (FIG. 2) which has a quantum efficiency of about 50% at ambient temperature and a lifetime of about 300 $\mu s$. According to the geometrical configurations used the emitted radiation is collected at one of the edges of the device since most of the light is emitted at angles more grazing to the surface than the initial angle of total internal reflection. The trapped light propagates by successive reflections to the narrow edges, provided with reflecting means, until it reaches the one edge where the solar cell is located, where it is allowed to escape and reach this cell. The effet is similar to that of fiber-optic waveguides. A preferred embodiment of the invention provides a device for utilizing in an efficient manner solar radiation and for converting it to electrical energy. The novel device according to the present invention provides for the absorption of solar radiation in a wide spectral range, overlapping with the solar spectrum and providing a narrow band emission in a predetermined range coinciding with that of the spectral efficiency of solar cells used in such device.

According to a preferred embodiment of the invention the novel device according to the present invention comprises a plurality of plates, stacked one on the other, which are preferably planar plates, made of a material adapted to absorb a predetermined substantial part of solar radiation, and adapted to emit said energy at predetermined wavelengths unto solar cells attached to lateral sides of the said plates. According to a preferred embodiment, the device comprises from 2 to 4 planar glass plates, made of special glasses, stacked one on top of the other, combined with mirrors of high reflectivity, provided at the bottom of the stack and at its sides not attached to solar cells. The collector, comprising said stack of plates, will absorb energy in the visible and UV parts of the solar spectrum and will emit fluorescence of light at wavelength at which solar cells attached to said stack are especially sensitive. There may be used suitable glasses in combination with silicon cells, with gallium arsenide and/or with cadmium sulfide cells. The photon-flux density can be theoretically increased by a factor of about 100 onto a photocell the area of which is $10^{-3}$ that of the area of the collector. When planar plates are used, which are the preferred embodiment of the invention, such plates have the additional advantage that it is possible to utilize scattered light as well as direct light, which is of importance on cloudy days. No tracking is required with such planar collectors. Excess photon energy is dissipated uniformly in the collector and thus semiconductor operation is not impaired. It is possible to obtain the resulting emitted radiation in predetermined ranges of wavelengths so as to make possible a high efficiency of conversion by means of the chosen photovoltaic cells. Furthermore, by obtaining radiations in a narrow wavelength range more effective antireflection coating can be used.

The operation of the novel collector is based on the high internal reflection of the fluorescent light in each of the plates constituting the stack, and such light in each of the plates will be concentrated within such plate and this reaches the photovoltaic cell attached to such plate at a high concentration. This is attained by using fluorescence and energy transfer between various inorganic ions.

The invention will be illustrated in the following with reference to a specific embodiment comprising 3 plates of glass, arranged one on top of the other. The plates are planar ones, and such planar plates are least expensive. When a stack of 3 plates is used, it is possible to absorb solar energy in the UV and visible parts of the spectrum and to convert the larger part of the solar energy to fluorescent light in the range of wavelengths at which silicon cells, gallium arsenide, and cadmium sulfide cells are especially sensitive.

Amongst the more important advantages of the novel collector units according to the present invention there may be mentioned a. simplicity of construction; b. inexpensive materials of the collector plates; c. absence of tracking means; d. utilization of diffuse light, increasing the hours per day during which the device can be effectively operated; e. the possibility to extend the life expectancy of the glass to that of the photovoltaic cells (about 30 years) by means of chemical treatment to increase resistance to environmental influence; f. utilization of parts of the spectrum at which given cells are not sensitive.

The distribution of solar energy in various parts of the spectrum and the effectivity of solar cells in various spectral ranges is given in Table I.

In order to attain a maximum of efficiency of energy conversion based on concentration based on internal reflection of fluorescent light, it is necessary to attain the following objectives:

1. A large part of the solar spectrum must be absorbed by the collector;
2. Overlap between absorption and emission must be avoided or minimized in order to prevent absorption losses of the internally reflected fluorescent light;
3. The emitted light ought to be in a narrow spectral range so as to make possible to use an efficient antireflective coating;
4. The emitted light ought to match the maximum sensitivity of the solar light used with the given plate;
5. The glass collector ought to be resistant to corrosion due to environmental influences.

Objective (1) can be attained by making use of a plurality of plates, doped so as to absorb and fluoresce in different wavelengths.

According to a preferred embodiment there are used three plane glass plates, the uppermost of which absorbs light in the UV and blue parts of the spectrum and emits fluorescent light in the green part of the spectrum. This matches the bandgap of CdS cells.

Light from the green and yellow parts of the spectrum penetrate the upper glass plate, together with light of longer wavelengths, and the green and yellow light are absorbed by the second glass plate which comprises suitable transition metal ions, such as trivalent chromium. These fluoresce in the red region of the spectrum and this matches the maximum efficiency of GaAs cells.

Light from the red part of the spectrum is absorbed in the third glass plate containing divalent rare earth ions in combination with trivalent rare earth ions which emit in the near IR part of the spectrum, matching the maximum efficiency of silicon cells.

Objectives (2) and (3) are attained by resorting to the use of a combination of suitable ions in each of the planar glass plates. The combination of uranyl and terbium (III) ions brings about a high absorption in the UV and blue parts of the spectrum, efficient energy transfer (about 90%) to $Tb^{3+}$ followed by narrow band emission at 540 nm with a quantum efficiency close to 100 percent. Similar combinations are resorted to in the second and third plates, according to the type of solar cells attached to these, respectively.

Objective (4) is attained by the choice of a suitable solar cell which is attached to the respective plates of the collector.

Objective (5) is attained by preparing glasses with a high content of trivalent ions which stabilize the glass and increase the refractive index.

It is possible to provide surface layers constituting solar cells on the lateral edges of the plates by epitaxial growth.

As pointed out above, the solar cell is advantageously attached to one of the lateral sides of the glass plate, and the other lateral sides, as well as the bottom of the lowermost glass plate are provided with a reflecting layer so as to minimize energy losses of unutilized solar radiation.

A plurality of suitably doped glass plates are stacked one above the other, each of the plates being adapted to absorb in a different region of the solar spectrum, and to each of the plates there is attached a solar cell which has a maximum efficiency in the range of the spectrum in which fluorescent light is emitted by said glass. The area and thickness of the individual glass plates may be varied within wide limits. Sizes from $1 \times 10$ cm to $100 \times 100$ cm with a thickness of from about 1 to 10 mm were found to give good results.

DESCRIPTION OF THE PREFERRED EMBODIMENT

The invention is described with reference to the following Examples which are to be construed in a non limitative manner. Modifications in the nature of glasses, photocells and arrangements can be resorted to without departing from the scope and spirit of the invention.

Figure 3:
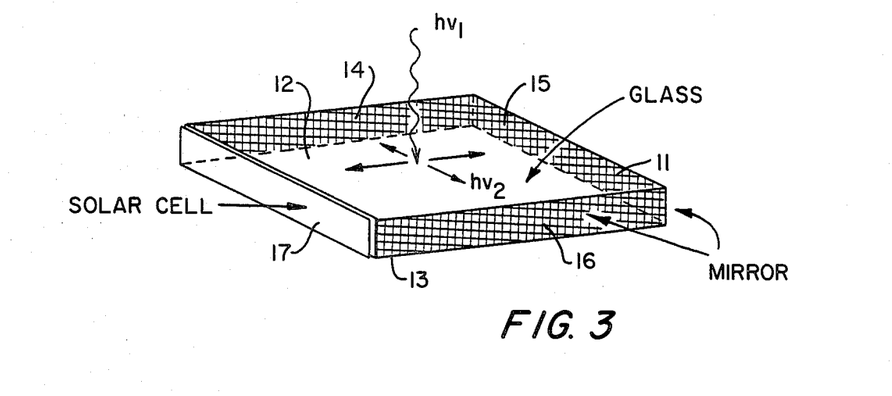
FIG. 3 is a schematic perspective view, not according to scale, of a device according to the invention.

DESCRIPTION OF FIG. 3

As shown in FIG. 3, a device 11 according to the present invention comprises a rectangular slab 12 of suitable doped glass, such as uranyl doped glass, which is provided at its lower surface with a reflecting layer 13 and at three of its lateral sides with reflecting layers 14, 15 and 16. The fourth edge 17 is open and attached to a solar cell 18, of the silicon type. The ratio of glass-surface area on which solar radiation impinges to the area of the solar cell 18 was in this specific case about 18:1. The device was irradiated by a high-pressure mercury lamp (100 W, distance: 10 cm) and a considerable increase of current and voltage was obtained. In Table 1 there is presented the ratio of short-circuit current of the cell obtained by the concentrated light via the collector to that of the current obtained from the cell connected to a blank undoped glass of identical geometry: I/I blank; while the ratio of current obtained by the cell connected to the collector against the cell exposed to direct illumination is given as I/I cell. The decrease at higher concentrations of uranyl ion is due to the concentration quenching of uranyl fluorescence. When the ratio is increased above the 18:1 ratio used, a further increase can be obtained. The device is advantageously used in conjunction with the type of silicon cells developed recently which are capable of utilizing a high flux density at a high efficiency.

TABLE 1

Ratio of short-circuit current obtained by concentrating the applied radiation (mercury lamp) by an uranyl-doped glass to that using an undoped glass

|  | wt-% $UO_2^{2+}$ in glass | | |
| --- | --- | --- | --- |
|  | 0.5 | 1.0 | 2.0 |
| $I/I_{blank}$ | 3.10 | 3.00 | 2.54 |
| $I/I_{cell}$ | 1.54 | 1.50 | 1.06 |

EXAMPLE 1

Collector consists of 3 plates.
Basic glass composition: $BaO \cdot P_2O_5$.
Preparation of the glass: The glass is prepared from a mixture of $NH_4H_2PO_4$ and $BaCO_3$ in the ratio 1:1 with the addition of dopant. The mixture is melted in a platinum crucible at 1350° C. for 5 hours with occasional stirring. The melt is transferred to a copper mold and annealed at 500° C. overnight.
Upper layer: 1 mole % uranyl.

| absorption | 300–480 nm |
| --- | --- |
| emission | 450–570 nm |
| cell | CdS |

Middle layer:
5 mole % $Eu^{3+}$ + 0.3 mole % $Cr^{3+}$.
The dopants are added as oxides and the melt is heated to 1450° C.

| absorption | 300–850 nm |
| --- | --- |
| emission | 800–1000 nm (max. at 900 nm) |
| cell | GaAs |

Lower layer:
2 mole % $Yb^{3+}$ + 3 mole % $Nd^{3+}$.
The dopants are added as oxides and the melt heated to 1350° C.

| absorption | 500–950 nm |
| --- | --- |
| emission | 960–1140 nm |
| cell | silicon |

EXAMPLE 2

Collector consists of 3 plates.
Basic glass composition:
52 mole % $SiO_2$;
4 mole % $Al_2O_3$;
36 mole % $Na_2O$;
8 mole % $CaO$.
Preparation of the glass: The basic ingredients are $SiO_2$, $Al_2(CO_3)_3$, $Na_2CO_3$ and $CaCO_3$, chemically pure. The powders are well mixed with addition of the dopant as an oxide, melted in air in a platinum crucible at 1400°–1500° C. from 1-4 days. The melt is poured into a steel mold and annealed at 500° C. overnight.
Upper layer: 1 mole % uranyl + 4 mole % $Tb^{3+}$.

| absorption | 350–490 nm |
| --- | --- |
| emission | 450–590 nm (max. at 540 nm) |
| cell | CdSe |

Middle layer: 0.2 mole % $Cr^{3+}$.

| absorption | 400–750 nm |
| --- | --- |
| emission | 800–880 nm (max. at 850 nm) |
| cell | GaAs |

Lower layer: 2 mole % $Yb^{3+}$ + 3 mole % $Nd^{3+}$.

| absorption | 500–950 nm |
| --- | --- |
| emission | 960–1140 nm |
| cell | silicon |

EXAMPLE 3

Collector consists of 2 plates.
Basic glass composition:
11 mole % $SiO_2$;
4.5 mole % $BaO$;
32 mole % $Al_2O_3$;
52 mole % $CaO$;
0.5 mole % $As_2O_3$.
Preparation of the glass: The basic ingredients are $SiO_2$, $BaCO_3$, $Al_2(CO_3)$, $CaCO_3$ and $As_2O_3$, chemically pure. The mixture with addition of dopant is melted in a zirconia crucible in a reducing atmosphere of 3 parts $N_2$ and 1 part $H_2$ at 1500° C. for 5 hours. The glass is annealed overnight at 600° C.
Upper layer: 1 mole % $Mn^{2+}$ (added as the acetate).

| absorption | 350–500 nm |
| --- | --- |
| emission | 500–600 nm (max. at 520 nm) |
| cell | CdS |

Lower layer: 0.2 mole % $Cr^{3+}$ + 3 mole % $Nd^{3+}$ + 2 mole % $Yb^{3+}$.

| absorption | 400–960 nm |
| --- | --- |
| emission | 1000–1100 nm |
| cell | silicon |

EXAMPLE 4

Collector consists of 3 plates.
Basic glass composition:
60 mole % $ZrF_4$;
34 mole % $BaF_2$;
6 mole % $PbF_2$.
Preparation of the glass: The oxides are mixed with twice the theoretical quantity of $NH_4F$ and HF in a platinum crucible. To the mixed components the rare earth fluoride is added and the mixture is then preheated for 1 hour to 400° C. in order to complete fluorination. The excess of $NH_4F$ and HF is evaporated at 800° C. The glasses are poured into a graphite mold and annealed overnight at 500° C.
Upper layer: 1 mole % $Mn^{2+}$.

| absorption | 300–500 nm |
| --- | --- |
| emission | 460–650 nm |
| cell | CdS |

Middle layer: 5 mole % $Er^{3+}$ + 2 mole % $Ho^{3+}$.

| absorption | 500–740 nm |

| | |
|---|---|
| emission | 750–860 nm |
| cell | GaAs |

Lower layer: 10 mole % $Yb^{3+}$ +5 mole % $Nd^{3+}$.

| | |
|---|---|
| absorption | 880–960 nm |
| emission | 1100 nm |
| cell | silicon |

EXAMPLE 5

Collector consists of 3 plates.
Basic glass composition:
60 mole % $SiO_2$;
2.5 mole % $Al_2O_3$;
27.5 mole % $Li_2O$;
10 mole % MgO.

Preparation of the glass: The components are taken as $SiO_2$, $Al_2CO_3$, $Li_2CO_3$ and $MgCO_3$ and melted in a platinum crucible in an electric furnace for 24 hours with repeated stirring at temperature 1350° to 1500° C. The melt is poured into a graphite mold and transferred to a copper plate for 24 hours at 450° C.

Upper layer: 0.1 mole % $Ce^{3+}$, 3.0 mole % $Mn^{2+}$ (added as oxides and heated in reducing atmosphere of 3 parts $N_2$ and 1 part $H_2$).

| | |
|---|---|
| absorption | 350–500 nm |
| emission | 500–650 nm |
| cell | CdS |

Middle layer: 0.3 mole % $Cr^{3+}$ +5 mole % $Nd^{3+}$ (added as oxides and heated in reducing atmosphere).

| | |
|---|---|
| absorption | 400–880 nm |
| emission | 880–1040 nm |
| cell | silicon |

Lower layer: 7 mole % $Yb^{3+}$.

| | |
|---|---|
| absorption | 960 nm |
| emission | 1050 nm |
| cell | silicon |

EXAMPLE 6

Collector consists of 3 plates.
Basic glass composition: $CaO.P_2O_5$
Preparation of the glass: As in Example 1 using $CaCO_3$.
Upper layer: 1 mole % $Mn^{2+}$ +5 mole % $Yb^{3+}$.

| | |
|---|---|
| absorption | 300–500 nm |
| emission | 1020 nm |
| cell | silicon |

Middle layer: 0.2 mole % $Cr^{3+}$ +5 mole % $Eu^{3+}$.

| | |
|---|---|
| absorption | 400–750 nm |
| emission | 800–900 nm |
| cell | GaAs |

Lower layer: 5 mole % $Yb^{3+}$.

| | |
|---|---|
| absorption | 940 nm |
| emission | 1050 nm |
| cell | silicon |

All the examples are summarized in Table 3.

EXAMPLE 7

Figure 4:
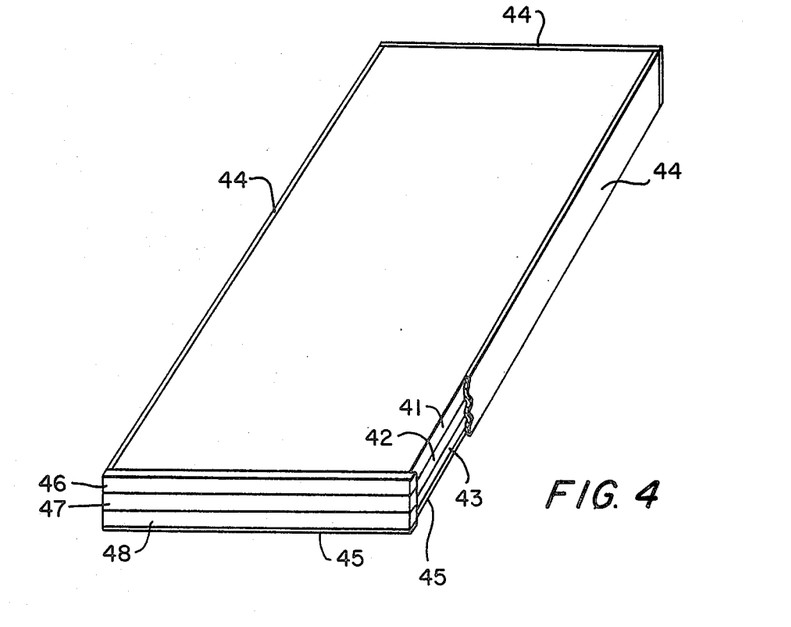
FIG. 4 is a perspective view of a 3-layer stack collector according to the present invention.
Figure 5:
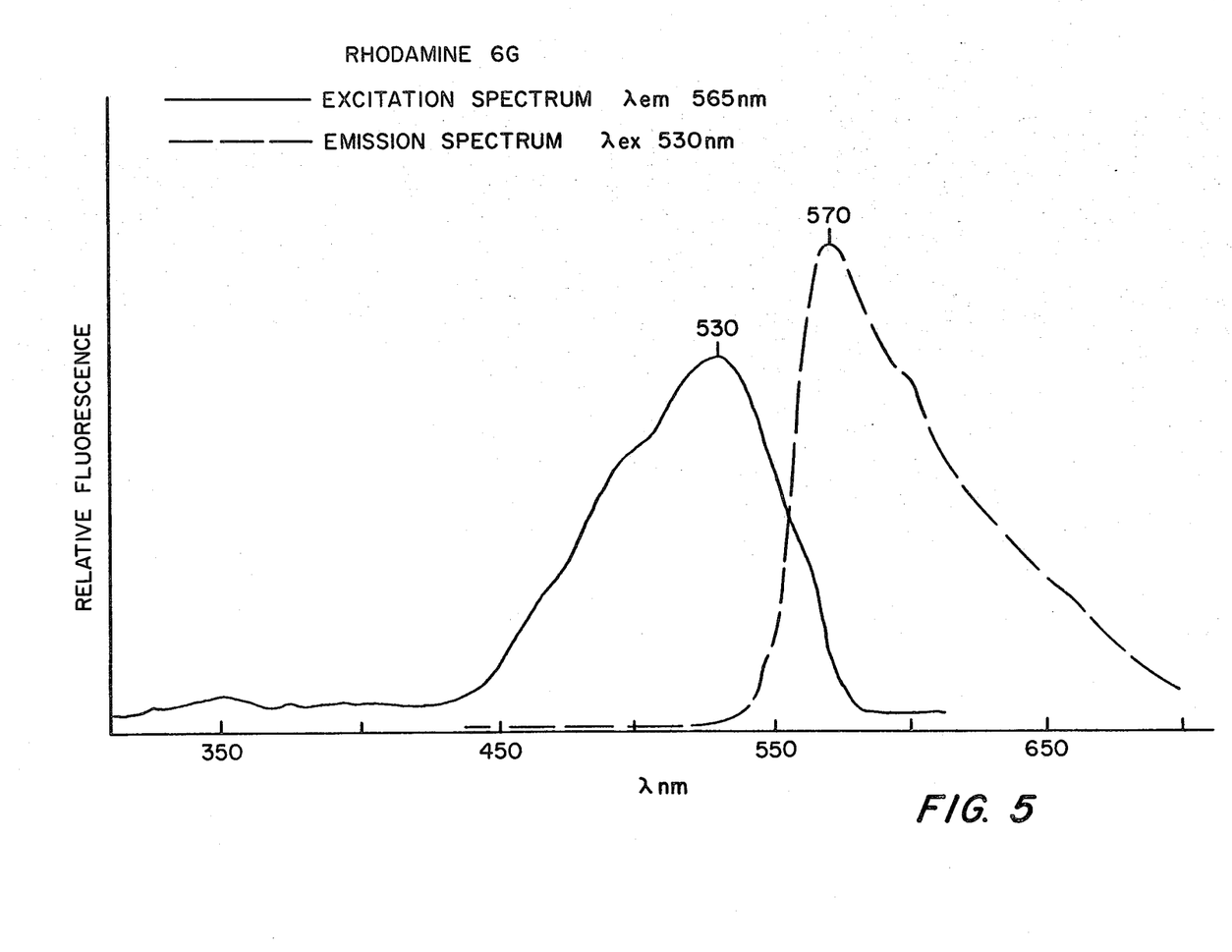
FIG. 5 illustrates the excitation and the emission spectrum of Rhodamine 6 G.
Figure 6:
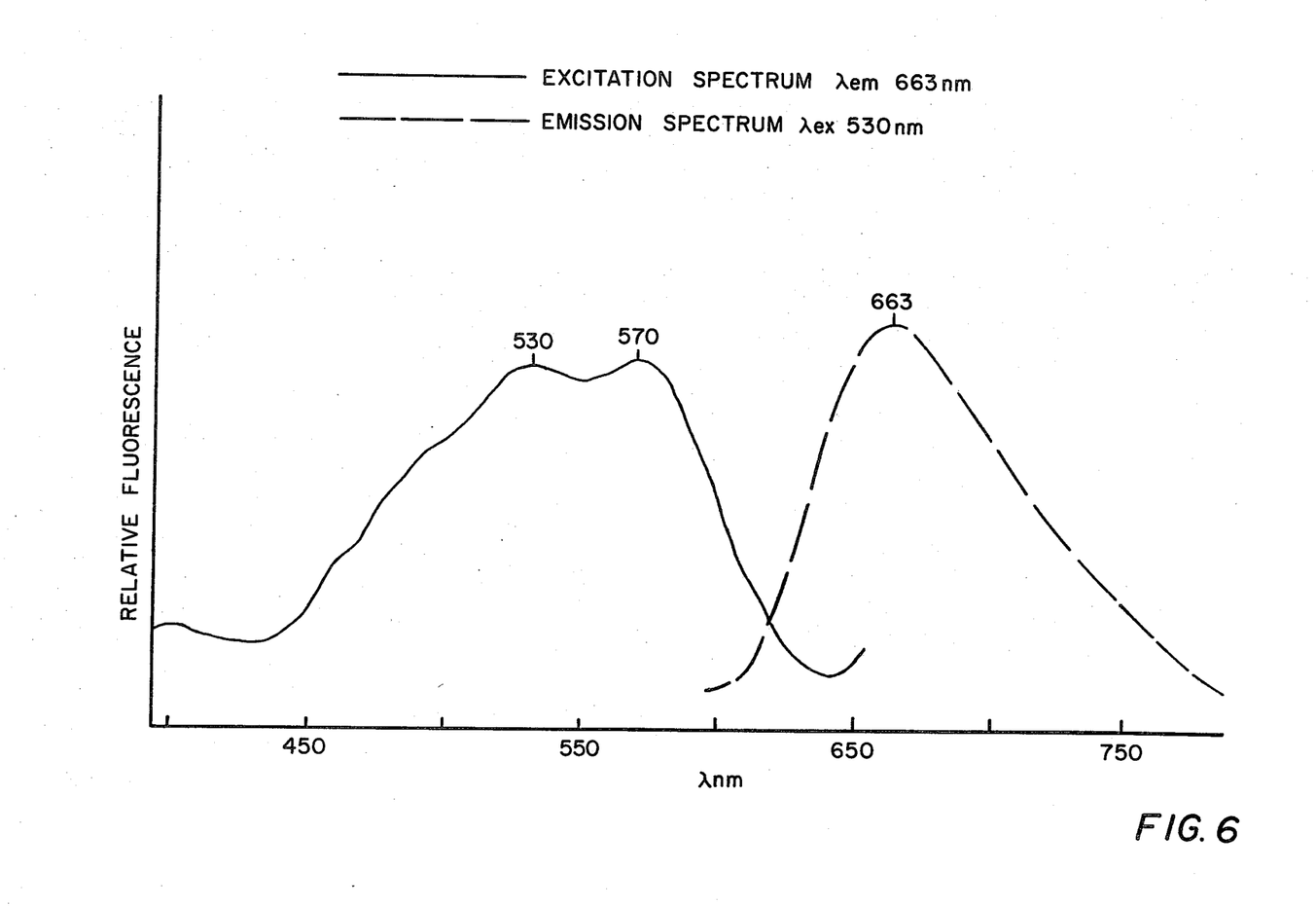
FIG. 6 illustrates the excitation and emission spectrum of 16,17-diheptanoyloxy violanthrone.

A stack, illustrated with reference to FIG. 4, was made from three glass plates 41, 42 and 43, each of which was 4 cm×75 cm, and had a thickness of 1 mm. Three of the lateral sides of each of the plates 41, 42 and 43 were provided with a reflective layer 44, and a reflective layer 45 was also provided at the bottom of plate 43. At one of the lateral sides of each of the glass plates there was attached a solar cell. The solar cells are 46 on plate 41, 47 on plate 42 and 48 on plate 43. The size of each of the cells is 0.1 cm×4 cm. and thus the overall area of the 3 cells is 1.2 cm².

The layers of the stack were as follows:
The first layer was prepared from a basic glass composition consisting of:
52 mole % $SiO_2$;
4 mole % $Al_2O_3$;
36 mole % $Na_2O$;
8 mole % CaO.

The dopants were 1 mole % $UO_2^{2+}$ (uranyl) and 4 mole % $Tb^{3+}$. The preparation of this glass was as set out in Example 2 and the cells attached to this glass was a CdS cell.

The second layer was prepared from a composition as follows:
11 mole % $SiO_2$;
4.5 mole % BaO;
32 mole % $Al_2O_3$;
52 mole % CaO;
0.5 mole % $As_2O_3$;
and the glass was prepared as set out in Example 3. The dopants used were 0.2 mole % $Cr^{3+}$ and 5 mole % $Eu^{3+}$.

The cell attached to this glass plate was a GaAs cell.
The third glass plate was prepared from:
11 mole % $SiO_2$;
5.0 mole % BaO;
32 mole % $Al_2O_3$;
52 mole % CaO.

The dopants used were 3 mole % $Yb^{3+}$ and 1 mole % $Nd^{3+}$. The glass was prepared as set out in Example 3. The cell attached to this glass plate was a Silicon cell.

As set out above, the cells 46, 47 and 48 were respectively CdS, GaAs and Silicon cells.

The collector received an energy of 30 W on a total surface area of 300 cm² (full sunlight). The glasses are sensitive to about 80 percent of the solar spectrum, which results in 24 W. The fluorescence efficiency is about 50 percent, resulting in 12 W; the collecting efficiency is again about 50%, resulting in 6 W, while the cell efficiency is about 20 percent, resulting in a total power output of about 1.2 W. This shows that it is possible to obtain from 1 m² of this type of collector an output of about 40 W.

EXAMPLE 8

1.25 g polymethylmethacrylate (PMMA) was dissolved in 25 ml of chloroform. A quantity of dye (Rhodamine 6G or 16,17-diheptanyloxyl violanthrone) was dissolved in chloroform and a quantity of concentrated solution was added to the PMMA solution to result in a solution containing a final concentration of the dye of $5 \times 10^{-3}$ M in the solution. A sheet of glass of 25 mm×80 mm×2 mm was thoroughly cleaned and dipped into one of the solutions at about 42° C. The applied layer dries immediately and there is obtained a transparent uniform fluorescent well adhering film of about 10 microns thickness.

When sunlight strikes a glass with such a film, there takes place an excitation of the fluorescence and a larger part of the resulting radiation enters the glass sheet and due to internal reflections the light finally emerges mainly at the lateral edges of the glass sheet, where a suitable photoelectric cell is applied which converts this concentrated light to electric energy.

When a single layer is used, the plastic layer is advantageously applied to the lower surface of the glass sheet. When a triple layer stack was used, the fluorescent plastic layer was applied to the upper surface of the middle glass sheet.

Experiments were carried out with various types of glasses. In one experiment a regular glass was used (Ca-Al-silicate glass) and to this there was applied a film of plastic as set out above containing Rhodamine G6. The application of the fluorescent plastic film resulted in a five- to six-fold increase of the radiation reaching the lateral edges of the glass sheet, and in an overall conversion of about 2% of the incident solar energy to electricity by means of a suitable solar cell applied to the lateral edges of the glass sheet.

Another experiment was carried out with a similar glass sheet containing 1 weight-% of uranyl ions and in this case a yield of about 3 to 3.5% was obtained.

The measured quantum efficiency of $Mn^{2+}$ in the above glasses is about 58% and that of $Cr^{3+}$ is about 14 to 17%. The efficiency of transfer from $UO_2^{2+}$ to $Nd^{3+}$ and that from $Nd^{3+}$ to $Yb^{3+}$ is about 91%.

The energy conversion, optical to electrical, in the glasses set out in Table 4 is about 3.5% to about 4.5%. This comparatively very high degree of conversion make it possible to set up conversion stacks having an appreciable electrical power output, which need practically no servicing, which can be efficiently operated over very prolonged periods of time and which do not require any auxiliary devices, such as tracking devices or the like.

The glasses remain stable over many years and thus such single- or multi layer devices are comparatively economical and can be used for many purposes where such power requirements exist.

Hitherto, experiments were carried out with glass sheets of dimensions as set out in the examples. Preliminary experiments indicate that the results can be obtained also with much larger sheets of glass, and that the overall conversion of optical to electric energy remains of the same order of magnitude, i.e. about 3 to 4.5% of total incident solar energy.

TABLE 2

Percentage distribution of solar energy (AM 2) at spectral ranges λ(nm), and bandgaps (in eV and nm) of obtainable solar cells indicating efficiencies when available

| Range | Spectral distribution of solar energy AM 2 | | Matching semiconductors bandgap | | Probable maximum efficiencies (percentage) |
|---|---|---|---|---|---|
| | Wavelength nm | Percentage | eV | nm | |
| Near UV | 315–400 | 2.7 | — | — | — |
| Blue | 400–510 | 14.6 | — | — | — |
| Green yellow | 510–610 | 16.0 | CdS[1] 2.4 | 516 | 24 |
| Red | 610–700 | 13.8 | CdSe 1.74 | 712 | — |
| Near IR | 700–920 | 23.5 | CdTe 1.44–1.5 | 843 | |
| | | | GaAs[2] 1.35–1.43 | 886 | 25–28 |
| IR | 920–1400 | 21.6 | Si[3] 1.11 | 1127 | 26–27 |
| Far IR | 1400–∞ | 7.8 | Ge 0.66 | 1878 | |

[1]CdS/CuInSe₂ single crystal heterojunction
[2]Ga$_x$Al$_{1-x}$/GaAs (200 times concentrated light)
[3]Interdigitated back contact silicon single crystal homojunction, 100 times concentration

TABLE 3

Summary of glass compositions and spectral ranges of absorption and emission and photovoltaic cell sensitivities

| Glass | Layer 1 | | | | Layer 2 | | | | Layer 3 | | | |
|---|---|---|---|---|---|---|---|---|---|---|---|---|
| | dopant | abs. (nm) | emission (nm) | cell | dopant | abs. (nm) | emission (nm) | cell | dopant | abs. (nm) | emission (nm) | cell |
| BaO.P₂O₅ | $UO_2^{2+}$ | 300–480 | 450–570 | CdS | $Cr^{3+}$ $Eu^{3+}$ | 300–850 | 800–1000 | GaAs | $Yb^{3+}$ $Nd^{3+}$ | 500–950 | 960–1140 | Si |
| SiO₂ Al₂O₃ Na₂O CaO | $UO_2^{2+}$ $Tb^{3+}$ | 350–470 | 450–590 | CdSe | $Cr^{3+}$ | 400–750 | 800–880 | GaAs | $Yb^{3+}$ $Nd^{3+}$ | 500–950 | 960–1140 | Si |
| SiO₂ BaO Al₂O₃ CaO As₂O₃ | $Mn^{2+}$ | 350–500 | 500–600 | CdS | $Cr^{3+}$ $Nd^{3+}$ $Yb^{3+}$ | 400–960 | 1000–1100 | Si | | | | |
| ZrF₄ BaF₂ PbF₂ | $Mn^{2+}$ | 300–500 | 500–600 | CdS | $Er^{3+}$ $Ho^{3+}$ | 500–740 | 750–860 | GaAs | $Yb^{3+}$ $Nd^{3+}$ | 880–960 | 1100 | Si |
| SiO₂ Al₂O₃ Li₂O MgO | $Ce^{3+}$ $Mn^{2+}$ | 300–500 | 500–600 | CdS | $Cr^{3+}$ $Nd^{3+}$ | 400–880 | 880–1040 | Si | $Yb^{3+}$ | 960 | 1050 | Si |
| CaO.P₂O₅ | $Mn^{2+}$ | 300–500 | 1020 | Si | $Cr^{3+}$ | 400–750 | 800–900 | GaAs | $Yb^{3+}$ | 940 | 1050 | Si |

TABLE 3-continued

Summary of glass compositions and spectral ranges of absorption and emission and photovoltaic cell sensitivities

| Glass | Layer 1 | | | | Layer 2 | | | | Layer 3 | | | |
|---|---|---|---|---|---|---|---|---|---|---|---|---|
| | dopant | abs. (nm) | emission (nm) | cell | dopant | abs. (nm) | emission (nm) | cell | dopant | abs. (nm) | emission (nm) | cell |
| | $Yb^{3+}$ | | | | $Eu^{3+}$ | | | | | | | |

TABLE 4

| Glass mole % | Layer 1 | | | | Layer 2 | | | | Layer 3 | | | |
|---|---|---|---|---|---|---|---|---|---|---|---|---|
| | dopant wt % | absorption nm | emission nm | cell | dopant wt % | absorption nm | emission nm | cell | dopant wt % | absorption nm | emission nm | cell |
| $Al_2O_3$ 20<br>$P_2O_5$ 65<br>BeO 12<br>$Li_2O$ 3 | 0.5 $UO_2^{2+}$ | 300–480 | 450–570 | Cds | 0.1 $C_2^{3+}$<br>+<br>thin layer<br>$5 \times 10^{-3}$M<br>Rhodamine 60 in PMMA | 450–680 | 800–1000 | Si | $2Nd^{3+}$<br>+<br>$3yb^{3+}$ | 500–950 | 970 | Si |
| MgO 15<br>$P_2O_5$ 70<br>ZnO 10<br>MnO 5 | 3 $Mn^{2+}$<br>(≡5 mol % MnO)<br>+<br>thin layer<br>$5 \times 10^{-3}$M<br>Violanthrone in PMMA | 350–400 | 550–750 | Si | | | | | | | | |
| MgO 15<br>$P_2O_5$ 64<br>ZnO 10<br>MnO 10<br>$UO_2^{2+}$ 1 | $6Mn^{2+}$<br>(≡10 mol % MnO)<br>+<br>2.5 $UO_2^{2+}$ | 350–670 | 950–1000 | Si | | | | | | | | |
| MgO 15<br>$P_2O_5$ 75<br>ZnO 10 | 1 $UO_2^{2+}$<br>+<br>2 $Nd^{3+}$ | 300–480 | 960 | Si | Glass<br>ZnO 35<br>$TeO_2$ 65<br>Dopant<br>$2Nd^{3+}$<br>+<br>$3Yb^{3+}$ | 500–950 | 970 | Si | | | | |

We claim:

1. A collector for high efficiency conversion of solar energy to electrical energy wherein solar energy is converted by suitably doped glasses to fluorescent radiation at longer wavelengths at which photovoltaic cells have a better efficiency comprising in combination three superpositioned plane sheets of doped glass wherein:

a first sheet is doped with ions so as to absorb a substantial part of the solar radiation in the ultra-violet and blue regions of the spectrum and to emit fluorescence in the green region of the spectrum, said first plate being uppermost and is a suitable glass plate doped with dopants selected from uranyl ions and uranyl ions plus terbium ions;

a second glass lower plate is doped with ions absorbing a substantial part of the solar energy in the yellow and green regions and emitting a fluorescence in the red region; and a third glass plate is doped with ions so as to absorb a substantial part of solar energy in the red region and to fluoresce in the infra-red region, each of the plates being provided with a photovoltaic cell at one of its lateral edges, the other lateral edges being provided with a reflective coating, each of said photovoltaic cells having a high efficiency in the region of the spectrum of the respective fluorescent radiation, the lowermost surface of the last glass plate being provided with a reflective coating.

2. A collector according to claim 1, wherein the uranyl ions are present at a concentration of about 1 mole percent.

3. A collector according to claim 1, wherein the dopant used comprises about 1 mole percent uranyl and about 4 mole percent terbium ions.

4. A collector according to claim 1 wherein the first glass plate is a $BaO.P_2O_5$, a $CaO.SiO_2$ or a $SrO.P_2O_5$ type glass.

5. A collector according to claim 1 wherein the second glass plate is a $BaO.P_2O_5$ glass doped with europium and chromium ions, or a $SiO_2.CaO$ glass doped with chromium ions or a CaO $SiO_2$ glass doped with chromium, neodymium and ytterbium ions or a $ZrF_4$-$BaF_2$-$PbF_2$ glass doped with erbium and holmium ions or a $SiO_2$ glass doped with chromium and neodymium ions.

6. A collector according to claim 1 wherein the third glass plate is a $BaO.P_2O_5$ glass doped with ytterbium and neodymium ions or a $CaO.SiO_2$ glass doped with ytterbium and neodymium ions or a $SiO_2$ glass doped with ytterbium ions.

7. A collector according to claim 1, wherein the first glass plate is doped with 1 mole percent uranyl ions, the second glass plate is doped with 5 mole percent europium ions and 0.3 mole percent chromium ions and the third glass plate is doped with 2 mole percent ytterbium ions and 3 mole percent neodymium ions.

8. A collector according to claim 1, wherein the first glass plate is doped with 1 mole percent uranyl ions and 4 mole percent terbium ions, the second glass plate is doped with 0.2 mole percent chromium ions and the third glass plate is doped with 2 mole percent ytterbium ions and 3 mole percent neodymium ions.

* * * * *